(12) United States Patent
Cao et al.

(10) Patent No.: US 7,929,304 B2
(45) Date of Patent: Apr. 19, 2011

(54) HEAT DISSIPATION APPARATUS

(75) Inventors: Liang-Liang Cao, Shenzhen (CN); Jeng-Da Wu, Taipei Hsien (TW); Yang Li, Shenzhen (CN)

(73) Assignees: Hong-Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 76 days.

(21) Appl. No.: 12/479,959

(22) Filed: Jun. 8, 2009

(65) Prior Publication Data

US 2010/0149749 A1    Jun. 17, 2010

(30) Foreign Application Priority Data

Dec. 17, 2008 (CN) .................. 2008 2 0303481 U

(51) Int. Cl.
*H05K 7/20* (2006.01)

(52) U.S. Cl. ............. 361/697; 361/679.47; 361/679.48; 361/679.49; 361/679.5; 361/679.51; 361/695; 165/80.3; 165/121; 165/104.33; 165/104.34

(58) Field of Classification Search ............ 361/679.46, 361/679.47, 679.48, 679.49, 679.54, 690–697, 361/700–712, 715–719; 165/80.3, 104.33, 165/80.4, 120, 121, 185; 174/15.1, 16.3, 252; 257/706–727; 454/184

See application file for complete search history.

(56) References Cited

U.S. PATENT DOCUMENTS

| | | | |
|---|---|---|---|
| 6,989,988 B2 * | 1/2006 | Arbogast et al. | 361/695 |
| 7,120,018 B2 * | 10/2006 | Shen et al. | 361/695 |
| 7,215,548 B1 * | 5/2007 | Wu et al. | 361/703 |
| 7,349,212 B2 * | 3/2008 | Xia et al. | 361/697 |
| 7,403,389 B2 * | 7/2008 | Yao et al. | 361/695 |
| 7,414,842 B2 * | 8/2008 | Hao et al. | 361/697 |
| 7,766,074 B2 * | 8/2010 | Lin et al. | 165/80.2 |
| 2006/0137861 A1 * | 6/2006 | Wang et al. | 165/104.33 |
| 2008/0101018 A1 * | 5/2008 | Long et al. | 361/695 |
| 2008/0121372 A1 * | 5/2008 | Zhou et al. | 165/80.3 |
| 2008/0151498 A1 * | 6/2008 | Zhang | 361/697 |
| 2009/0316358 A1 * | 12/2009 | Zheng et al. | 361/697 |
| 2010/0061060 A1 * | 3/2010 | Tien et al. | 361/697 |

* cited by examiner

*Primary Examiner* — Michael V Datskovskiy
(74) *Attorney, Agent, or Firm* — D. Austin Bonderer

(57) ABSTRACT

A heat dissipation apparatus for dissipating heat from two heat sources includes a heat sink, and a fan mounted on the heat sink. The heat sink includes a base and a plurality of parallel fins positioned on the base, the base contacts with one of the two heat sources for thermally conducting the heat generated by the one of the two heat sources. The fan is configured to generate airflow through the fins in such a manner that airflow flows from a second side of the fins to a first side of the fins. A deflecting member is mounted on the first side of the fins for deflecting airflow from the fan towards the second of the two heat sources.

12 Claims, 2 Drawing Sheets

1

HEAT DISSIPATION APPARATUS

BACKGROUND

1. Technical Field

The present disclosure relates to a heat dissipation apparatus.

2. Description of Related Art

Electronic devices in computers, such as central processing units (CPUs), generate heat during normal operation, which can deteriorate their operational stability, and damage associated electronic devices. Thus, the heat must be removed quickly to ensure normal operation of the CPU. A typical heat dissipation apparatus includes a heat sink mounted on a CPU to remove heat, and a fan fixed on the heat sink to generate airflow through the heat dissipation apparatus. However, the typical heat dissipation apparatus can only dissipate heat for a single heat source, and has a low efficiency.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
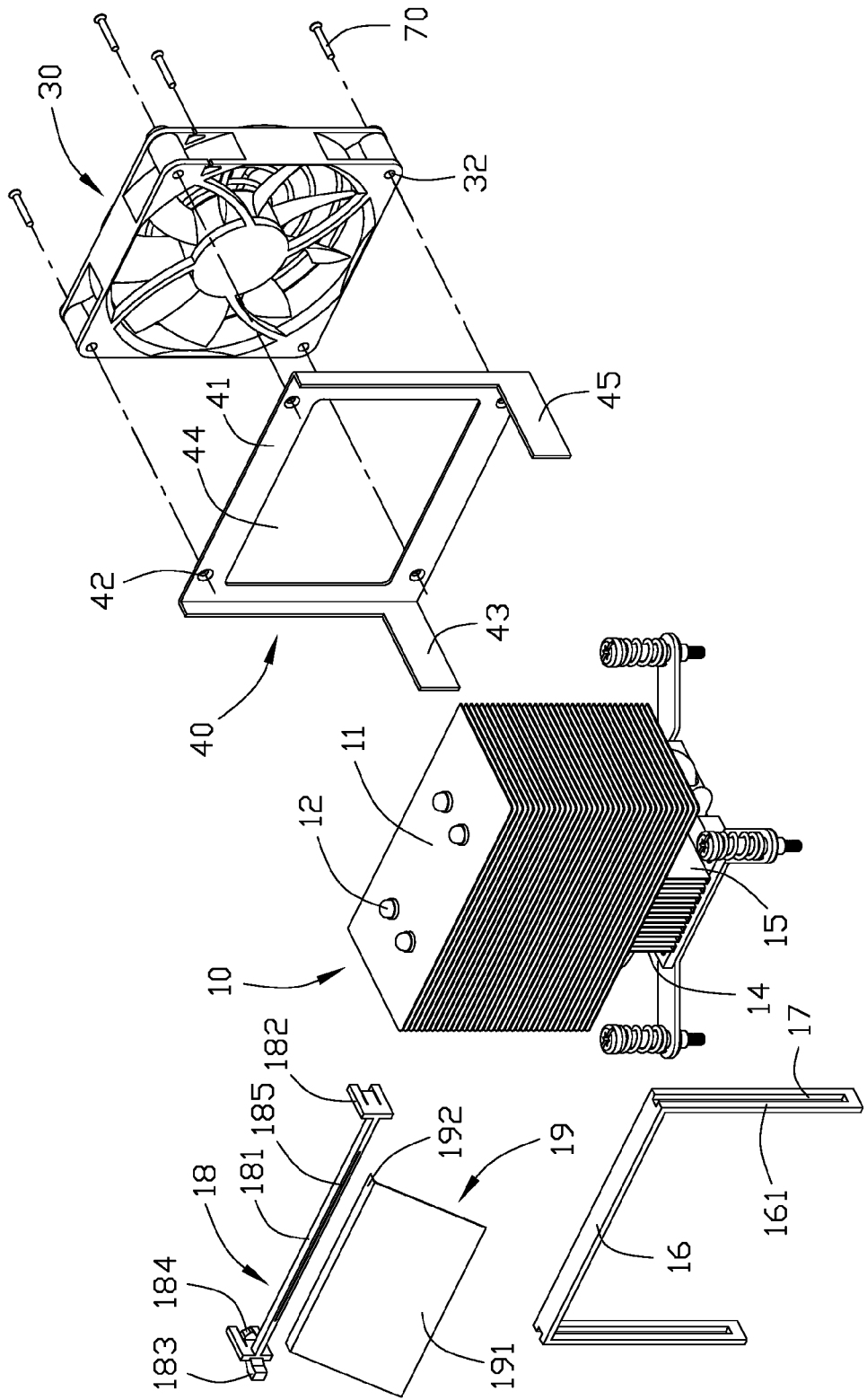
FIG. 1 is an exploded view of an embodiment of a heat dissipation apparatus.

FIG. 1 is an exploded view of an embodiment of a heat dissipation apparatus. The heat dissipation apparatus includes a heat sink 10, a fan 30, and a mounting bracket 40.

The heat sink 10 includes a base 15, and a plurality of heat pipes 12 positioned on a top surface thereof. A plurality of parallel fins 11 is secured on the heat pipes 12 with the heat pipes 12 passing therethrough. A bottom surface of the base 15 is configured to contact a heat source, such as a central processing unit (CPU) on a motherboard. The heat generated by the heat source is transmitted from the base 15 to the fins 11 via the heat pipes 12. A plurality of vertical conducting fins 14 is positioned on the base 15 and in contact with the heat pipes 12. The conducting fins 14 transmit the heat from the bottom surface to the top surface of the base 15 and the heat pipes 12.

The heat dissipation apparatus has an "n"-shaped sliding bracket 16 adapted to be mounted on a first side of the fins 11. The sliding bracket 16 includes two parallel vertical guiding arms 161. Each guiding arm 161 defines a guiding slot 17 therein. A fixing bracket 18 is capable of being slidably disposed in the guiding slots 17. The fixing bracket 18 includes a horizontal fixing bar 181, and two shoulders 182 extending from two ends of the fixing bar 181. Each shoulder 182 defines a sliding block 184 for sliding in the guiding slot 17. A handle 183 is formed on one of the shoulders 182. The fixing bar 181 defines a fixing slot 185 therein. A deflecting member 19 is capable of being disposed in the fixing slot 185. The deflecting member 19 includes a deflecting portion 191 for deflecting airflow from the fan 30, and an inserting portion 192 extending from a side edge of the deflecting portion 191 for fixing in the fixing slot 185. Position of the deflecting member 19 can be adjusted by pushing the handle 183 and sliding the fixing bracket 18 in the guiding slots 17.

The mounting bracket 40 is an elastic piece, and is adapted to be mounted on a second side of the fins 12. The mounting bracket 40 includes a front plate 41 and two side plates 43, 45 extending perpendicularly from opposite edges of the lower portions of the front plate 41. The front plate 41 defines a rectangular opening therein for guiding airflow from the fan 30. Four fastener holes 42 are defined near the four corners of the mounting bracket 40. Four fixing holes 32 are defined near the four corners of the fan 30 corresponding to the fastener holes 42.

Figure 2:
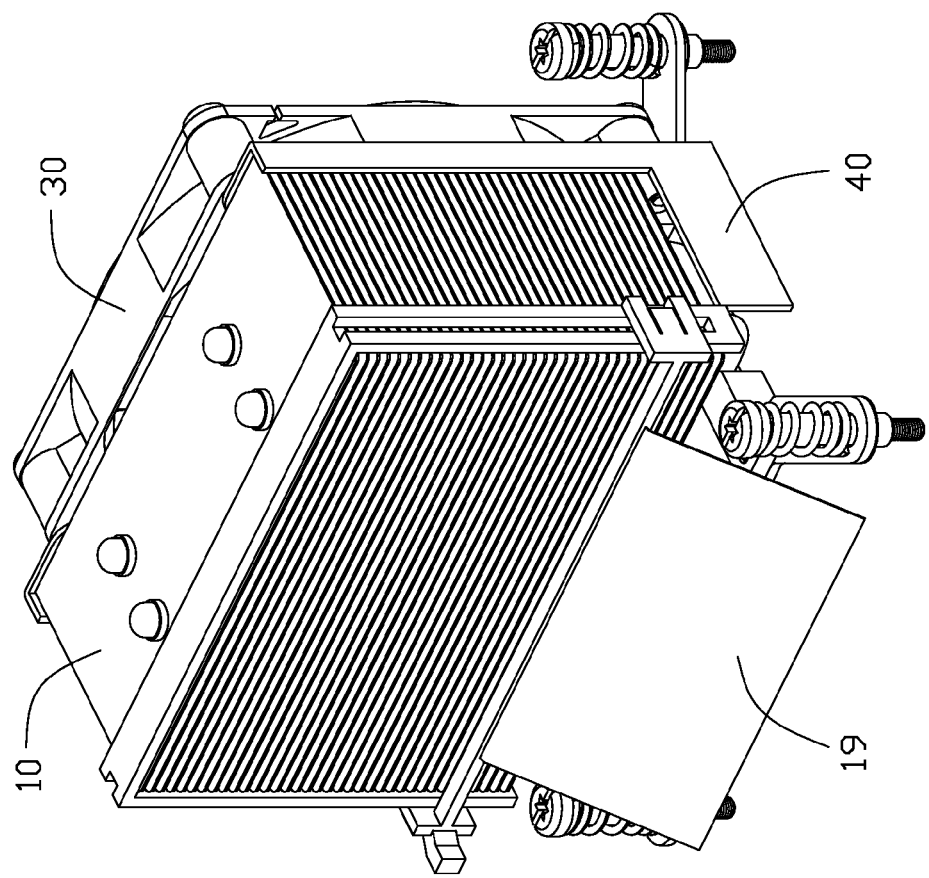
FIG. 2 is an assembled view of the heat dissipation apparatus of FIG. 1.

Referring to FIG. 2, in assembly, the side plates 43, 45 of the mounting bracket 40 are pulled outward in opposite directions to receive the parallel fins 11 in a space cooperatively formed by the front plate 41, and the side plates 43, 45. When the plurality of the parallel fins 11 resists the front plate 41, the side plates 43, 45 are released to sandwich the parallel fins 11 therebetween. The fan 30 is fixed to the mounting bracket 40 by four fasteners 70 received in the fastener holes 42 through the fixing holes 32. The guiding arms 161 of the sliding bracket 16 are pulled outward in opposite directions to fix the sliding bracket 16 onto the fins 11. The sliding blocks 184 of the fixing bracket 18 slide into the guiding slots 17 of the sliding bracket 16. The inserting portion 192 is inserted into the fixing slot 185 for fixing the deflecting member 19 to the fixing bracket 18.

When the fan 30 rotates, the heat accumulated around the heat sink 10 will be absorbed by airflow from the fan 30. Some of the airflow produced by the fan 30 will pass through the plurality of the parallel fins 11 and be deflected by the deflecting member 19 towards other heat sources on the motherboard. The heat accumulated on the other heat source can be absorbed by the deflected airflow. The efficiency of heat dissipation for the entire motherboard is improved. The height of the deflecting member 19 is adjustable by sliding the fixing bracket 18. The deflecting member 19 is adjusted to an appropriate height according to the position of the other heat source.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation apparatus for dissipating heat from two heat sources, comprising:
   a heat sink comprising a base and a fin structure, the fin structure comprises of a plurality of parallel fins, the base contacting with one of the two heat sources for thermally conducting the heat generated by one of the two heat sources;
   a fan configured to generate airflow through the fins in such a manner that airflow flows from a second side of the fins to a first side of the fins; and
   a deflecting member mounted on the first side of the fins for deflecting airflow from the fan towards the second of the two heat sources, wherein a height of the deflecting member is adjustable relative to a position of the second of the two heat sources.

2. The heat dissipation apparatus of claim 1, wherein the deflecting member comprises a deflecting portion, and an inserting portion extending from a side edge of the deflecting portion.

3. The heat dissipation apparatus of claim 2, wherein the heat sink further comprises a fixing bracket for fixing the deflecting member, the fixing bracket comprises a fixing bar, the fixing bar defines an inserting slot thereon, the inserting portion is inserted into the inserting slot to connect the deflecting member and the fixing bracket.

4. The heat dissipation apparatus of claim 3, wherein the fixing bracket further comprises two shoulders extending from two ends of the fixing bar, each shoulder defines a sliding block; the heat sink further comprises a sliding bracket, the sliding bracket defines two guiding slots, the sliding blocks are slidably received into the guiding slots.

5. The heat dissipation apparatus of claim 4, wherein the fixing bar further comprises a handle extending from one of the shoulders.

6. The heat dissipation apparatus of claim 4, wherein the sliding bracket comprises two vertical guiding arms for sandwiching the parallel fins therebetween, the guiding slots are defined on the corresponding guiding arms.

7. The heat dissipation apparatus of claim 1, further comprising a mounting bracket with four fastener holes; and the fan further comprises four fixing holes, the fixing holes correspond to the fastener holes, the fan is fixed onto the mounting bracket by four fasteners received in the fixing holes.

8. The heat dissipation apparatus of claim 1, further comprising a mounting bracket with four fastener holes; and the fan further comprises four fixing holes, the fixing holes correspond to the fastener holes, the fan is fixed onto the mounting bracket by four fasteners received in the fixing holes.

9. A heat dissipation apparatus for dissipating heat from two heat sources, comprising:
   a heat sink assembly comprising a heat sink in contact with one of the two heat sources for thermally conducting the heat, and a deflecting member mounted thereon; and
   a fan configured to generate airflow through the heat sink, wherein the airflow flows from a second side of the heat sink to a first side of the heat sink, the deflecting member is mounted on the first side of the heat sink to deflect the airflow from the fan towards the second of the two heat sources, wherein the deflecting member comprises a deflecting portion, and an inserting portion extending from a side edge of the deflecting portion; the heat sink further comprises a fixing bracket for fixing the deflecting member, the fixing bracket comprises a fixing bar, the fixing bar defines an inserting slot, and the inserting portion is configured to insert into the inserting slot to connect the deflecting member and the fixing bracket.

10. The heat dissipation apparatus of claim 9, wherein the fixing bracket further comprises two shoulders extending from two ends of the fixing bar, each shoulder defines a sliding block; the heat sink further comprises a sliding bracket, the sliding bracket defines two guiding slots, the sliding blocks are slidably received into the guiding slots.

11. The heat dissipation apparatus of claim 10, wherein the fixing bar further comprises a handle extending from one of the shoulders.

12. The heat dissipation apparatus of claim 10, wherein the sliding bracket comprises two vertical guiding arms for sandwiching the parallel fins therebetween, the guiding slots are defined on the corresponding guiding arms.

\* \* \* \* \*